United States Patent

Miyazaki et al.

[11] Patent Number: 5,431,179
[45] Date of Patent: Jul. 11, 1995

[54] WAFER DRYING APPARATUS AND FIRE-EXTINGUISHING METHOD THEREFOR

[75] Inventors: Takanori Miyazaki, Kumamoto; Kazuhiko Kobayashi, Tosu; Yuuji Kamikawa; Chihaya Tashima, both of Kumamoto, all of Japan

[73] Assignees: Tokyo Electron Limited, Tokyo; Tokyo Electron Kyushu Limited, Tosu, both of Japan

[21] Appl. No.: 197,285

[22] Filed: Feb. 16, 1994

[30] Foreign Application Priority Data

Feb. 16, 1993 [JP] Japan ................. 5-026485

[51] Int. Cl.⁶ ................. B08B 13/00; F26B 25/00
[52] U.S. Cl. ................. 134/61; 34/544; 68/209; 134/113; 134/902; 202/170; 203/DIG. 7
[58] Field of Search ................. 134/61, 105, 107, 108, 134/113, 902; 34/544; 68/492, 209; 202/170; 203/DIG. 7

[56] References Cited

U.S. PATENT DOCUMENTS

| | | | |
|---|---|---|---|
| 3,580,261 | 5/1971 | Key | 68/209 X |
| 4,262,430 | 4/1981 | Janson et al. | 68/209 X |
| 4,736,758 | 4/1988 | Kusuhara | 134/105 X |
| 4,995,172 | 2/1991 | Friedrichs | 68/209 X |
| 5,197,203 | 3/1993 | Lenoir | 34/494 X |
| 5,201,958 | 4/1993 | Breunsbach et al. | 134/902 X |
| 5,240,018 | 8/1993 | Clark et al. | 134/902 X |
| 5,273,060 | 12/1993 | Hill, III et al. | 134/113 X |
| 5,275,184 | 1/1994 | Nishizawa et al. | 134/902 X |
| 5,299,584 | 4/1994 | Miyazaki et al. | 134/902 X |

FOREIGN PATENT DOCUMENTS 61-152020 7/1986 Japan .
61-237429 10/1986 Japan .
61-237430 10/1986 Japan .

*Primary Examiner*—Philip R. Coe
*Attorney, Agent, or Firm*—Oblon, Spivak, McClelland, Maier & Neustadt

[57] ABSTRACT

A wafer drying apparatus incorporated in a semiconductor wafer cleaning system includes a bath for storing IPA. A heater for generating an IPA vapor is arranged on the bath. The bath is surrounded by a housing. The housing has opening portions at three positions. The opening portions are opened/closed by shutters. A sensor for detecting a fire and a nozzle for discharging $CO_2$ gas into the bath are arranged around the bath. A plurality of wafers are held by a chuck of a convey robot and are conveyed from the outside of the housing into the housing via the opening portions. When a fire is detected by the sensor, the chuck immediately retreats from the housing, and the shutters are closed. Signals for closing the shutters are transmitted to shutter drive sources again 10 seconds after the fire is detected, and discharging of $CO_2$ gas is started 20 seconds after the fire is detected.

10 Claims, 5 Drawing Sheets

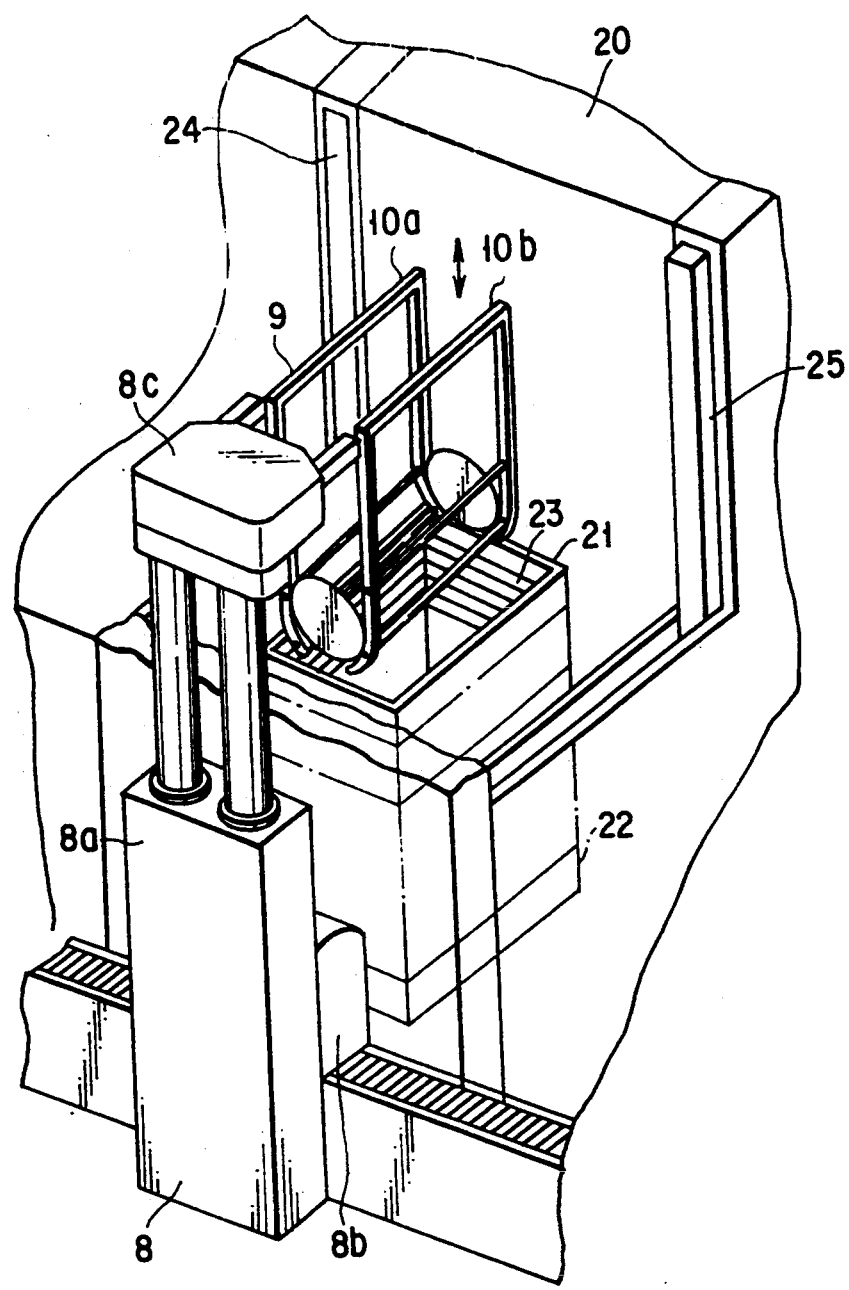
F I G. 1

WAFER DRYING APPARATUS AND FIRE-EXTINGUISHING METHOD THEREFOR

BACKGROUND OF THE INVENTION

1. Field of the Invention

The present invention relates to a wafer drying apparatus using a vapor of a combustible organic solvent such as isopropyl alcohol (IPA), and a fire-extinguishing method therefor.

2. Description of the Related Art

In the manufacturing process of a semiconductor device, a wafer drying apparatus is used to dry a semiconductor wafer by using a vapor of an organic solvent such as IPA after a cleaning step. The wafer drying apparatus using IPA includes an organic solvent bath made of quartz or the like and designed to store IPA. A heater for heating IPA to generate an IPA vapor is arranged at a lower portion in the bath. A cooler for cooling the IPA vapor and condensing it is arranged at an upper portion in the bath.

An elevator for holding a plurality of wafers and moving them vertically is arranged in the organic solvent bath. A wafer conveyed from a previous step (usually, a washing step) is placed on the elevator. The wafer is temporarily immersed in a vapor atmosphere at a lower portion in the bath, and moisture and the like adhering to the wafer are replaced with IPA. Thereafter, the wafer is moved to an upper portion in the bath to be dried.

A plurality of shutters are arranged around the organic solvent bath. While a drying process is not performed, the shutters are kept closed to isolate the bath from the outside so as to minimize the leakage of IPA.

As described above, the wafer drying apparatus includes the heater, and an organic solvent such as IPA is inflammable. Therefore, many of such drying apparatuses have fire-extinguishing mechanisms for quickly extinguishing a fire when IPA or the like is set on fire.

In a drying apparatus having such a fire-extinguishing mechanism, when a fire is detected by various types of sensors, an alarm is generated immediately, and the power to the apparatus is turned off. Subsequently, after an elapse of a predetermined period of time, e.g., 20 seconds, which is required for an operator to escape, $CO_2$ gas is discharged from a nozzle arranged at an upper portion or the like in the bath. Note that the apparatus generally includes a manual switch to allow an operator or the like to start the fire-extinguishing mechanism upon a manual operation as well as detection of a fire by means of sensors.

As described above, in the IPA drying apparatus, when a fire is detected, or the manual switch is operated, $CO_2$ gas for a fire-extinguishing operation is discharged after an elapse of about 20 seconds. With this operation, the safety of an operator and the like can be ensured, and an erroneous switching operation can be canceled. In this drying apparatus, however, a further improvement in safety is required.

SUMMARY OF THE INVENTION

It is, therefore, an object of the present invention to achieve a further improvement in safety in a wafer drying apparatus using a vapor of a combustible organic solvent.

According to the present invention, there is provided an apparatus for drying a wafer by using a combustible organic solvent, comprising: a bath for storing the solvent in a liquid phase; a housing which surrounds the bath, the housing having an opening portion communicating with the bath; a shutter which is driven by shutter driving means to open/close the opening portion of the housing; heating means for heating the solvent in the bath to generate a vapor of the solvent; a convey member for conveying the wafer from the outside of the housing into the housing via the opening portion to perform a drying process by exposing the wafer to the vapor of the solvent in the housing; detection means for detecting combustion of the solvent in the bath and thereupon generating a fire detection signal; discharging means for discharging a fire-extinguishing agent into the bath; and control means for closing the shutter in response to the fire detection signal from the detection means, and subsequently causing the discharging means to discharge the fire-extinguishing agent into the bath.

As described above, in the conventional wafer drying apparatus, when a fire is detected by the sensors, the power to the apparatus is immediately turned off. For this reason, the shutters cannot be opened/closed afterward. If the shutters are open, a large amount of a fire-extinguishing agent, e.g., $CO_2$ gas, may flow outside. In the wafer drying apparatus of the present invention, since a fire-extinguishing gas is supplied to the organic solvent bath after the shutters are closed, a fire-extinguishing operation can be efficiently performed. In addition, the apparatus restrains a fire-extinguishing agent from flowing outside, thereby improving the safety.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a perspective view showing a wafer drying apparatus according to an embodiment of the present invention;

DETAILED DESCRIPTION OF THE PREFERRED EMBODIMENT

Figure 2:
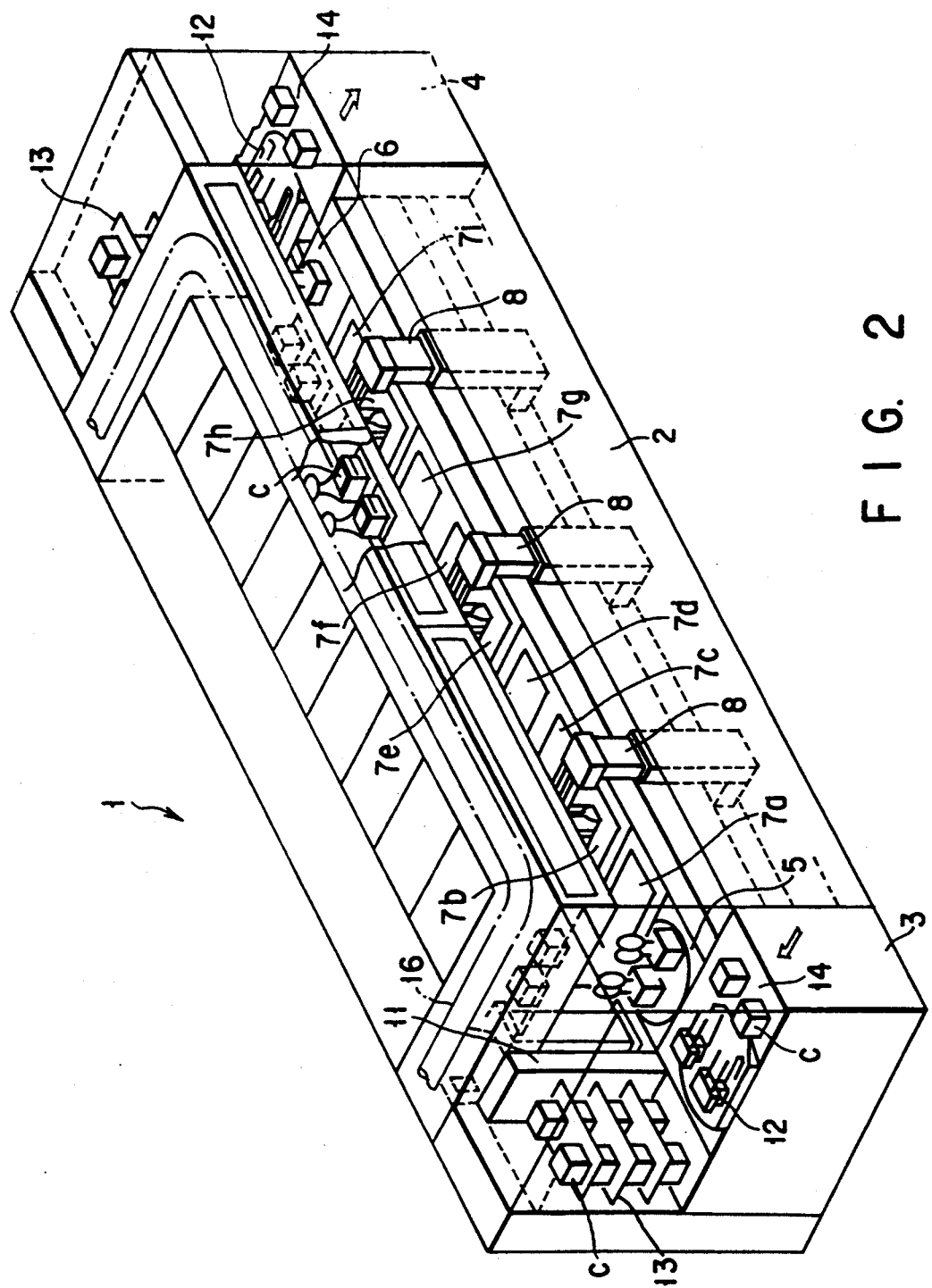
FIG. 2 is a perspective view showing a cleaning system incorporating the drying apparatus in FIG. 1.

For example, a drying apparatus according to the present invention is incorporated, as a wafer drying section, in a semiconductor wafer cleaning system shown in FIG. 2. As shown in FIG. 2, a cleaning system 1 is constituted by a total of three zones, i.e., an input unit 3, a cleaning unit 2, and an output unit 4.

A carrier convey unit 12 is arranged in the input unit 3. The carrier convey unit 12 serves to convey a wafer carrier C conveyed from the outside by a convey robot and the like. The carrier C is designed to store a predetermined number of wafers, e.g., 25 wafers, before a cleaning process. The carrier C placed on a table 14 of the input unit 3 is directly conveyed to the cleaning unit 2 or conveyed to a store section 13 by the carrier convey unit 12. The carrier C is then set in a standby state.

In the cleaning unit 2, a loader 5 is arranged to be adjacent to the input unit 3. For example, the loader 5 takes out wafers from the carrier C, performs orientation flat alignment, and detects the number of wafers. The carrier C is conveyed from the store section 13 to the loader 5 by the carrier convey unit 12. An unloader 6 is also arranged in the cleaning unit 2 to be adjacent to the output unit 4. For example, the unloader 6 transfers wafers onto the carrier C, performs orientation flat alignment, and detects the number of wafers. The carrier C is conveyed from the unloader 6 to the output unit 4 by the carrier convey unit 12 arranged in the output unit 4.

Three wafer convey robots 8 are arranged on the front surface side (front side in FIG. 2) of the cleaning unit 2. A carrier cleaning line 16 is arranged at an upper portion of the cleaning unit 2 to extend along the cleaning unit 2. The carrier cleaning line 16 serves to clean and dry the carrier C after wafers are removed therefrom by the wafer convey robot 8 on the upstream side. The carrier C is supplied to the carrier cleaning line 16 by the loader 5 and a lifter 11.

A lifter (not shown) similar to the lifter 11 is arranged on the output unit 4 side. An empty carrier C, which has passed through the carrier cleaning line 16, is set at a predetermined position on the unloader 6 by this lifter.

In the cleaning unit 2, a plurality of processing sections 7a to 7i, each having a bath made of, e.g., a quartz, are arranged in line. More specifically, the processing sections 7a to 7i are sequentially arranged from the loader 5 side in the following order: the chuck cleaning section 7a, the first chemical washing section 7b, the water washing sections 7c and 7d, the second chemical washing section 7e, the water washing sections 7f and 7g, the chuck cleaning section 7h, and the drying section 7i. The chuck cleaning section 7a cleans and dries a wafer chuck 9 of the wafer convey robot 8 on the upstream side. The first chemical washing section 7b cleans contaminants, e.g., contaminating organic substances, metallic substances, and particles, from a wafer surface with a chemical. The water washing sections 7c and 7d wash the wafer cleaned by the first chemical washing section 7b with, e.g., pure water. The second chemical washing section 7e performs a cleaning operation with a chemical different from that used by the first chemical washing section 7b. The water washing sections 7f and 7g wash the wafer cleaned by the second chemical washing section 7e with, e.g., pure water. The chuck cleaning section 7h cleans and dries the wafer chuck 9 of the wafer convey robot 8 on the downstream side. The drying section 7i dries the wafer, from which contaminants are removed, with a vapor of IPA (isopropyl alcohol) or the like. In the chemical washing sections 7b and 7e, the respective cleaning solutions overflow and circulate, and contaminants accumulated in the cleaning solutions are removed at the time of circulation.

Each wafer convey robot 8 has an elevating member 8a mounted on a base 8b which moves along the arranging direction of the respective cleaning sections. The elevating member 8a has a pair of shafts capable of moving vertically. A chuck driving member 8c is mounted on the shafts. The chuck driving member 8c moves the chuck 9 in the longitudinal direction of each cleaning section, and opens/closes the chuck 9.

The wafer chuck 9 has a pair of opposing arms 10a and 10b pivotally supported on the front surface of the chuck driving member 8c. Wafer holding grooves are formed in the surface of each of lower traverse rods of the arm 10a and 10b at predetermined intervals. When the peripheral portions of wafers are inserted in the holding grooves, and the arm 10a and 10b are pivoted inward, i.e., closed, the wafers are held by the arm 10a and 10b. For example, 50 wafers are held by the wafer chuck 9 at once.

The operation of the cleaning system 1 will be described next.

When semiconductor wafers stored in the carriers C in units of 25 wafers are supplied to the table 14 of the input unit 3, the carrier convey unit 12 moves the supplied carriers C, two at a time, to the loader 5. The carriers C supplied afterward are transferred to the store section 13 to be temporarily stored therein.

When the two carriers C are supplied to the loader 5, the loader 5 align the orientation flats of the wafers in the two carriers C in one direction and positions 50 wafers. In addition, the wafer convey robot 8 on the upstream side sets the wafer chuck 9 above the chuck cleaning section 7a. The chuck 9 is then cleaned and dried to prepare for reception of the wafers from the loader 5.

When the loader 5 brings the two sets of the wafers in the two carriers C close to each other while lifting the wafers from the two carriers C, the wafer convey robot 8 is driven to hold the 50 wafers with the chuck 9. The chuck 9 which is holding the wafers is moved to the first chemical washing section 7b by the wafer convey robot 8. At the position of the first chemical washing section 7b, the chuck 9 is lowered to transfer the 50 wafers to a wafer holding member (not shown) in the first chemical washing section 7b, whereby the wafers are immersed in a processing solution and cleaned.

When the process with respect to the wafers in the first chemical washing section 7b is completed, the chuck 9 of the wafer convey robot 8 receives the wafers from the wafer holding member of the section 7b by a reverse process to that described above, and transfers the wafers to the wafer holding member of the water washing section 7c, in which a water washing process is performed in the same manner as described above. Furthermore, the wafers are subjected to the same water washing process in the water washing section 7d, thus completing the first cleaning process. Thereafter, the same cleaning process as that described above is performed in the second chemical washing section 7e and the water washing sections 7f and 7g by using the chuck 9 of the wafer convey robot 8 at the intermediate position. The wafer convey robot 8 on the downstream side then receives the wafers from the water washing section 7g, and the wafers are dried in the drying section 7i by using a vapor of IPA.

After the drying process, the wafers are stored in the two carriers C set in a standby state by the unloader 6 having the same arrangement as that of the loader 5. The carriers C set in the standby state by the unloader 6 have been cleaned and dried through the carrier cleaning line 16 so that particles and the like have been removed from the carriers C. Thereafter, the wafers are transferred to the next step in units of carriers via the output unit 4.

Figure 3:
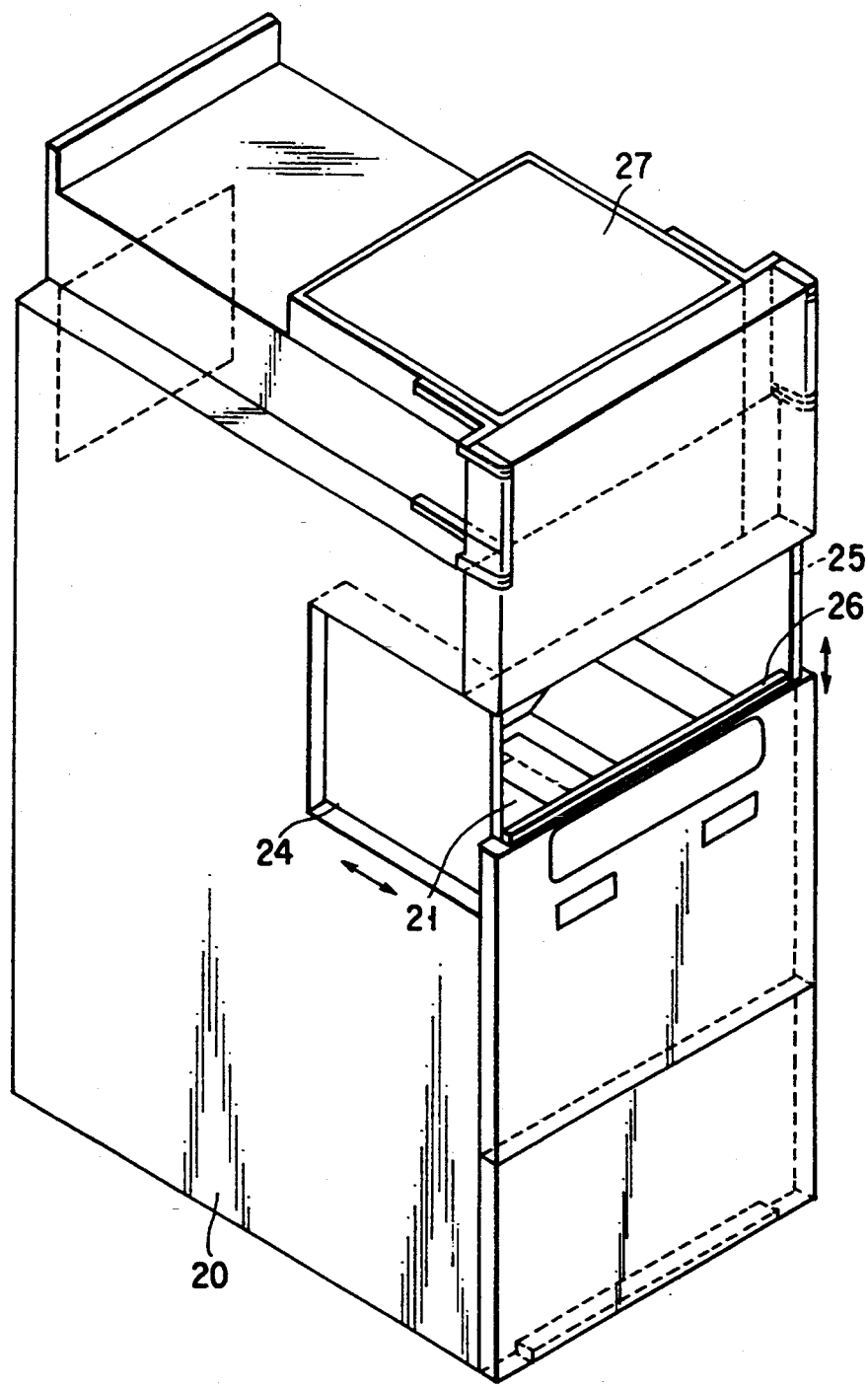
FIG. 3 is a perspective view showing the outer appearance of the drying apparatus in FIG. 1.

FIGS. 1 and 3 show the arrangement of the drying section 7i. An organic solvent bath 21 made of, e.g., quartz is arranged in a housing 20 which surrounds the drying section 7i. A heater 22 is arranged at a lower portion in the organic solvent bath 21. The heater 22 heats IPA in a liquid phase, stored in the organic solvent bath 21, to generate a vapor of IPA. A cooling coiled pipe 23 is arranged at an upper portion in the bath 21. Cooling water or the like is circulated in the cooling coiled pipe 23 to cool the vapor.

The wafer convey robot 8 can be positioned in front of the organic solvent bath 21. Fifty wafers are held by the wafer chuck 9 of the robot 8. These wafers are guided into the bath 21 from above through an opening portion of the housing 20 so as to be subjected to a drying process. In this embodiment, the drying process is performed while the wafers are held by the wafer convey robot 8. Therefore, the production of dust upon transferring of the wafers can be restricted as compared with a case wherein another wafer holding member for a drying process is used in the bath 21. In addition to the above-described advantage, the chuck cleaning section 7h need not perform cleaning and drying processes with respect to the chuck 9 after a wafer drying process.

Figure 4:
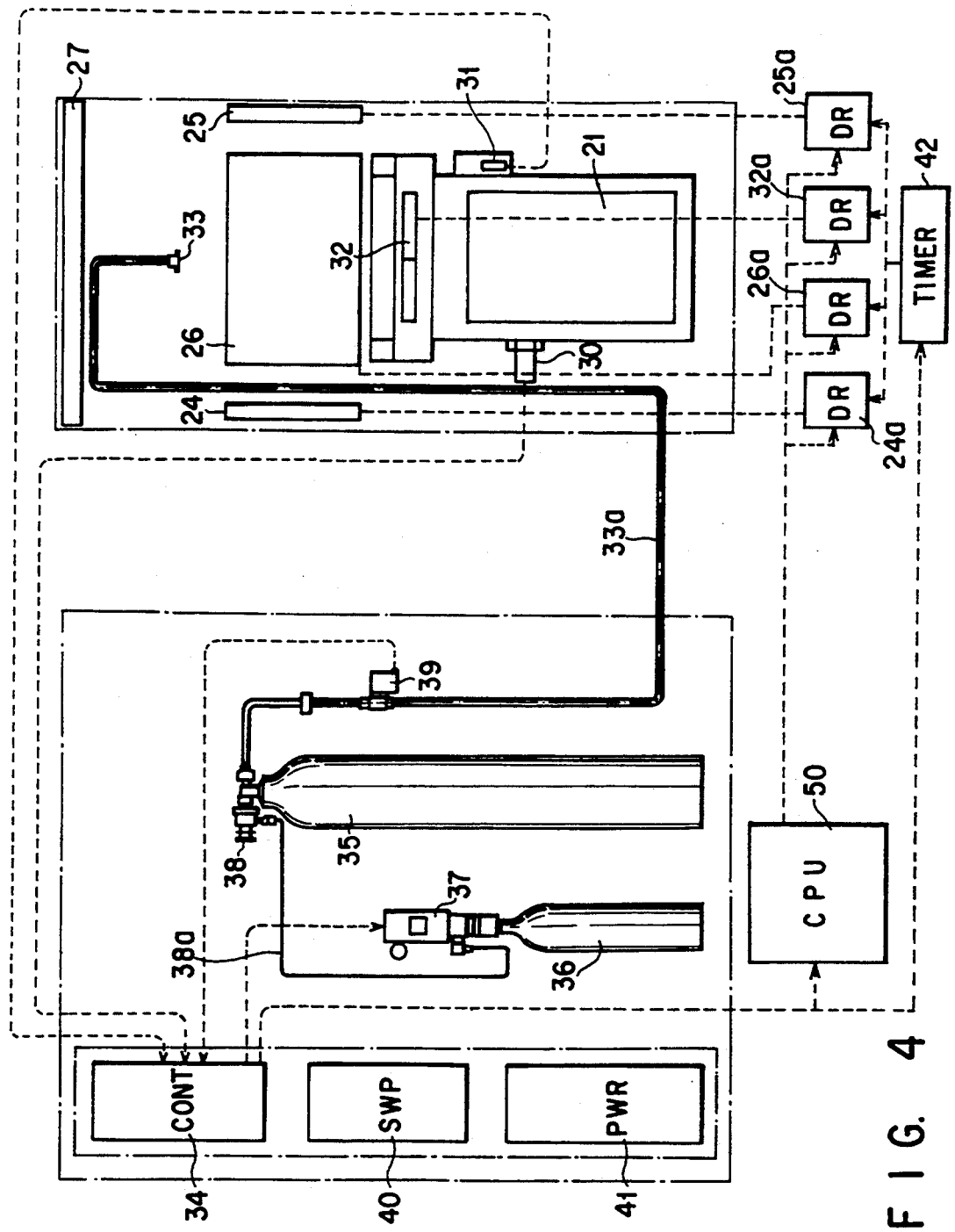
FIG. 4 is a block diagram showing a diagrammatic representation of the fire-extinguishing mechanism of the drying apparatus in FIG. 1.

As shown in FIG. 3, side shutters 24 and 25 and a front shutter 26 are arranged on opening portions in the sides and front of the housing 20. These shutters 24 to 26 serve to open/close the respective opening portions. The shutters 24 and 25 slide in the horizontal direction, and the shutter 26 slides in the vertical direction. The shutters 24 to 26 respectively have different drive sources 24a, 25a, and 26a, as shown in FIG. 4, so as to be independently opened/closed. The shutters 24 to 26 are used to isolate the bath 21 from the outside while a wafer drying process is not performed, the shutters 24 to 26 are closed to prevent the IPA vapor from leaking outside.

As shown in FIGS. 3 and 4, a filter/fan unit 27 is arranged at an upper portion in the housing 20. The filter/fan unit 27 serves to form a downflow of cleaned air in the housing 20. An auto-cover 32 is arranged on an upper portion of the bath 21. The cover 32 is driven by a drive source 32a to freely open/close the upper surface of the bath 21. A nozzle 33 for discharging $CO_2$ for a fire-extinguishing operation is arranged above the cover 32. The nozzle 33 is interposed between the cover 32 and the filter/fan unit 27.

A fire-extinguishing mechanism according to the present invention comprises a flame sensor 30 for detecting flames by using ultraviolet rays, and a temperature sensor 31. These sensors 30 and 31 are arranged on side portions of the organic solvent bath 21. The sensors 30 and 31 are connected to a controller 34. When a fire is detected by the sensors 30 and 31, detection signals, i.e., fire detection signals, are input first to the controller 34. The controller 34 then transmits the signals from the sensors 30 and 31 to a CPU 50 without any delay. The CPU 50 serves to control the overall cleaning system 1. At the same time, the controller 34 starts a timer 42. The CPU 50 and the timer 42 send signals to the drive sources 24a, 25a, 26a, and 32a, in the form to be described later, to drive the shutters 24, 25, and 26 and the cover 32.

The fire-extinguishing mechanism has a $CO_2$ cylinder 35 connected to the nozzle 33 via a pipe 33a. The pipe 33a is connected to the cylinder 35 via an on/off valve 38. In addition, a pressure sensor 39 is arranged in the pipe 33a to check whether $CO_2$ is discharged. The on/off valve 38 is a pneumatic valve, which is driven by a pressurized gas from a cylinder 36 connected to the on/off valve 38 via a conduit 38a. The conduit 38a is connected to the cylinder 36 via an on/off valve 37. The on/off valve 37 is an electromagnetic valve, which is driven by a signal from the controller 34. Referring to FIG. 4, reference numeral 40 denotes a switch panel; and 41, a power supply.

The controller 34 has its own timer. Upon reception of detection signals from the sensors 30 and 31, the controller 34 opens the cylinder 36 after an elapse of a predetermined period of time, e.g., 20 seconds. With this operation, the valve 38 of the $CO_2$ cylinder 35 is opened by a pressurized gas from the cylinder 36, and $CO_2$ is discharged from the nozzle 33. Discharging of $CO_2$ is confirmed by the pressure sensor 39, and the corresponding information is fed back to the controller 34.

Figure 5:
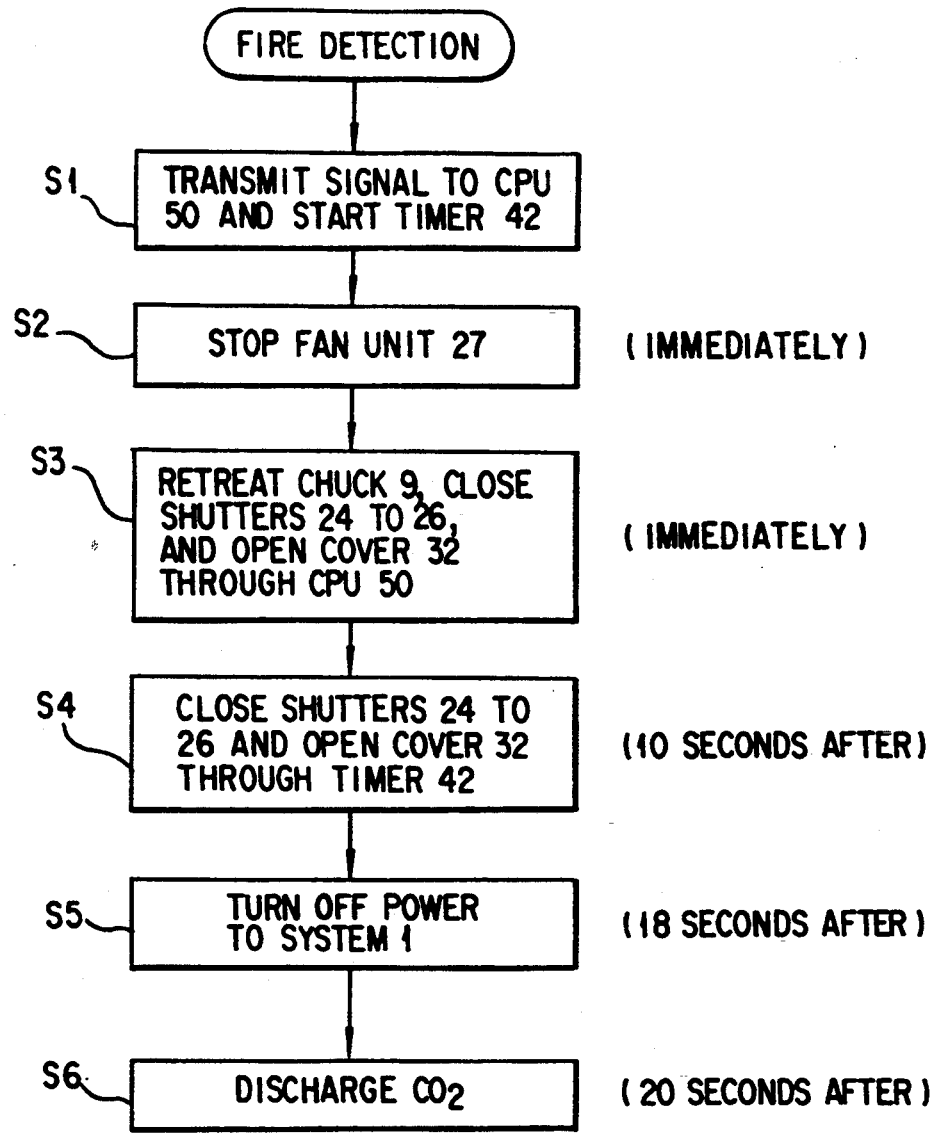
FIG. 5 is a flow chart showing a fire-extinguishing operation of the drying apparatus in FIG. 1.

A fire-extinguishing operation to be performed when a fire breaks out will be described next with reference to FIG. 5.

When the fire is detected by the sensors 30 and 31, the detection signals, i.e., the fire detection signals, are input first to the controller 34. The controller 34 transmits the detection signals from the sensors 30 and 31 to the CPU 50 at once (step S1).

Upon reception of the fire detection signals, the CPU 50 is set in a fire-extinguishing mode, and immediately stops the filter/fan unit 27 to stop the supply of a downflow (step S2). At the same time, the CPU 50 causes the chuck 9 of the wafer convey robot 8 to retreat from the organic solvent bath 21, closes the shutters 24, 25, and 26, and opens the cover 32 (step S3). The operations in steps S2 and S3 are executed as a mode of software for controlling the overall cleaning system 1. Retreating of the chuck 9, closing of the shutters 24, 25, and 26, and opening of the cover 32 are normally completed within 10 seconds after the CPU 50 receives the fire detection signals.

In addition, the controller 34 immediately starts the timer 42 in response to the fire detection signals from the sensors 30 and 31 so as to start measuring time (step S1). After 10 seconds are measured since the timer 42 is started, i.e., the fire breaks out, the timer 42 directly supplies forcible driving signals to the drive sources 24a, 25a, 26a, and 32a to forcibly close the shutters 24, 25, and 26 and forcibly open the cover 32 (step S4). These forcible driving signals are transmitted without the mediacy of the CPU 50. This operation is performed to provide protection against troubles in control performed by the CPU 50 using software.

Subsequently, the controller 34 turns off the power switch of the overall cleaning system 1 except for the controller 34 after an elapse of 18 seconds since the reception of the fire detection signals from the sensors 30 and 31 (step S5). The controller 34 starts discharging $CO_2$ from the nozzle 33 after an elapse of 20 seconds since the reception of the fire detection signals from the sensors 30 and 31 (step S6).

As described above, when a fire breaks out, the cover 32 is opened to supply $CO_2$ while the shutters 24, 25, and 26 are closed to isolate the organic solvent bath 21 from the outside. A fire-extinguishing operation can be efficiently performed. In addition, an improvement in safety can be achieved by restraining fire-extinguishing $CO_2$ gas from flowing outside. Furthermore, after closing of the shutters 24, 25, and 26 and opening of the cover 32 are executed by the software of the CPU 50, forcible driving signals are supplied to the corresponding drive sources again via a different system. Therefore, these operations can be reliably performed.

In the above-described embodiment, since the nozzle 33 is arranged above the cover 32, $CO_2$ is supplied after the cover 32 is opened. If, however, the nozzle 33 is arranged at a position where it can directly supply $CO_2$ into the organic solvent bath 21, for example, a position below the cover 32, $CO_2$ can be supplied while the cover 32 is closed.

In addition, in the above embodiment, when a fire breaks out, if a trouble occurs in the control system constituted by the CPU 50 and designed to control the wafer convey robots 8, the side shutters 24 and 25 are closed, but the front shutter 26 is stopped in contact with the chuck 9. Therefore, in order to prevent such a situation, the convey robots 8 may also be forcibly caused to retreat from the housing 20 in response to the signal from the timer 42, in synchronism with the operations of the shutters and the like, as needed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for drying a wafer by using a combustible organic solvent, comprising:
   a bath for storing the solvent in a liquid phase;
   a housing which surrounds said bath, said housing having an opening portion communicating with said bath;
   a shutter which is driven by shutter driving means to open/close the opening portion of said housing;
   heating means for heating the solvent in said bath to generate a vapor of the solvent;
   a convey member for conveying the wafer from the outside of said housing into said housing via the opening portion to perform a drying process by exposing the wafer to the vapor of the solvent in said housing;
   detection means for detecting combustion of the solvent in said bath and thereupon generating a fire detection signal;
   discharging means for discharging a fire-extinguishing agent into said bath; and
   control means for closing said shutter in response to the fire detection signal from said detection means, and subsequently causing said discharging means to discharge the fire-extinguishing agent into said bath.

2. An apparatus according to claim 1, wherein said control means comprises
   a main control section for controlling operations of said shutter and said convey member to perform the drying process with respect to the wafer, said main control section causing said convey member to retreat from said housing and closing said shutter immediately after the fire detection signal is generated,
   a timer for transmitting a signal for closing said shutter to said shutter driving means at the end of a first period of time after the fire detection signal is generated, the first period of time being set to terminate after said shutter is closed by said main control section, and
   a fire-extinguishing control section for causing said discharging means to discharge at the end of a second period of time, which is longer than the first period of time, after the fire detection signal is generated.

3. An apparatus according to claim 2, wherein said discharging means comprises a nozzle, arranged above said bath, for discharging the fire-extinguishing agent.

4. An apparatus according to claim 3, further comprising a cover arranged between said nozzle and said bath and opened/closed by cover driving means, wherein said main control section opens said cover immediately after the fire detection signal is detected, and said timer transmits a signal for opening said cover to said cover driving means at the end of the first period of time after the fire detection signal is detected.

5. An apparatus according to claim 4, wherein said control means turns off power to the overall apparatus except for said fire-extinguishing control section at the end of a third period of time, which is longer than the first period of time and shorter than the second period of time, after the fire detection signal is generated.

6. A cleaning system comprising:
   (a) a loading section for loading a carrier in which a plurality of wafers are stored before a cleaning process;
   (b) a washing section for washing a batch of wafers;
   (c) a drying section for drying a batch of wafers, which have been washed in the washing section, by using a combustible organic solvent, said drying section including
   a bath for storing the solvent in a liquid phase,
   a housing which surrounds said bath, said housing having an opening portion communicating with said bath,
   a shutter which is driven by shutter driving means to open/close the opening portion of said housing,
   heating means for heating the solvent in said bath to generate a vapor of the solvent,
   detection means for detecting combustion of the solvent in said bath and thereupon generating a fire detection signal, and
   discharging means for discharging a fire-extinguishing agent into said bath;
   (d) an unloading section for unloading the carrier in which a plurality of wafers which have undergone the cleaning process are stored;
   (e) convey means for conveying the wafer among said loading, washing, drying, and unloading sections, said convey means including a convey member for conveying the wafer from the outside of said housing into said housing via the opening portion to perform a drying process by exposing the wafer to the vapor of the solvent in said housing of said drying section; and
   (f) control means for closing said shutter in response to the fire detection signal from said detection means of said drying section, and subsequently causing said discharging means to discharge the fire-extinguishing agent into said bath.

7. A system according to claim 6, wherein said control means comprises
   a main control section for controlling an overall operation of said system, said main control section causing said convey member to retreat from said housing and closing said shutter immediately after the fire detection signal is generated, a timer for transmitting a signal for closing said shutter to said shutter driving means at the end of a first period of time after the fire detection signal is generated, the first period of time being set to terminate after said shutter is closed by said main control section, and a fire-extinguishing control section for causing said discharging means to discharge at the end of a second period of time, which is longer than the first period of time, after the fire detection signal is generated 8. A system according to claim 7, wherein said discharging means comprises a nozzle, arranged above said bath, for discharging the fire-extinguishing agent.

9. A system according to claim 8, wherein said drying section further comprises a cover arranged between said nozzle and said bath and opened/closed by cover driving means, said main control section opens said cover immediately after the fire detection signal is detected, and said timer transmits a signal for opening said cover to said cover driving means at the end of the first period of time after the fire detection signal is detected.

10. A system according to claim 7, wherein said control means turns off power to the overall system except for said fire-extinguishing control section at the end of a third period of time, which is longer than the first period of time and shorter than the second period of time, after the fire detection signal is generated.

* * * * *